July 17, 1956 E. L. WOODCOCK 2,755,381

DELAY LINE TRIGGER CIRCUIT

Filed April 18, 1952

INVENTOR
EUGENE L. WOODCOCK
BY Paul B. Hunter
ATTORNEY

United States Patent Office 2,755,381

Patented July 17, 1956

2,755,381

DELAY LINE TRIGGER CIRCUIT

Eugene L. Woodcock, Levittown, N. Y., assignor to Sperry Rand Corporation, a corporation of Delaware Application April 18, 1952, Serial No. 283,057

2 Claims. (Cl. 250—27)

This invention relates to a regenerative delay line circuit, and, more particularly, to an apparatus for generating a plurality of successively delayed output pulses initiated from a single input trigger pulse.

Various means have been heretofore proposed for producing accurately timed delay trigger pulses, as for example, by means of multivibrators, phantastron circuits, matrix circuits, and delay lines. The choice of the circuit to be used in any particular situation depends on a number of factors including the desired time delay between output pulses, the accuracy of the delay intervals, the wave shape of the pulses and other similar considerations.

Multivibrators and phantastron circuits are generally used where a relatively long delay interval is desired, particularly of the order of 10 microseconds or longer. While multivibrators may be cascaded to obtain a plurality of successively delayed output pulses, the application of such a cascade arrangement is limited by the relatively long delay period between successive pulses. Such cascade arrangements have the further disadvantage that if one stage is for any reason rendered inoperative, no output pulses are derived from any of the succeeding stages.

The delay line, employing either a lumped element artificial line or a distributed impedance transmission line, is particularly useful where a relatively short delay interval is required between the input and output pulses. Not only does the delay line provide a very accurate delay interval, but it has the advantage of being an entirely passive network. However, where longer delay intervals are required, the length of the delay line introduces appreciable attenuation and distortion of the input pulse, requiring special considerations in designing the delay line which make its use uneconomical and prohibitively complicated where substantial delay intervals are sought.

Where it is desired to obtain a plurality of output pulses sequentially triggered by a single input pulse, the delay line may be used by tapping off at various points along the line. However, the number of and delay intervals between output pulses is limited by the attenuation and harmonic distortion of the delay line.

The general object of the present invention is to avoid and overcome the foregoing and other difficulties in and objections to prior art practices by the provision of a triggering circuit which is characterized by its simplicity, accuracy, and reliability over a wide range of delay time intervals.

Another object of this invention is the provision of means for generating a plurality of successive output pulses at very short intervals of the order of less than ten microseconds.

Another object of this invention is to provide triggering apaparatus in which the next successive output pulse is not dependent on the generation of any one previous output pulse.

Another object of this invention is the provision of a plurality of sequentially spaced output pulses from a single delay line where the time interval between the first and last of the succession of output pulses may be of any desired delay period within the wide limits of 0.1 μsec. to 30 μsec. or longer.

Another object of this invention is to provide a sharp, accurately timed output pulse, a long delay time interval after an initiating input pulse with a delay line of relatively poor quality and of inexpensive design.

These and other objects of the present invention which will hereinafter become apparent as the description proceeds are achieved by the provision of apparatus for generating a plurality of output pulses in time sequence at predetermined time intervals following an initiating input pulse, which apparatus comprises a simple delay line including a plurality of sections, each section having lumped inductance and capacitance constants for producing a predetermined transmission delay time per section. A plurality of blocking oscillators are connected in shunt across the delay line, the blocking oscillators being connected at points along the delay line determined by the desired time delay intervals between the successive output pulses. The input pulse traveling down the delay line sequentially triggers the shunt blocking oscillators, and the blocking oscillators each in turn regenerate the input pulse to maintain its amplitude and wave shape as it travels down the length of the delay line.

For a better understanding of the invention, reference should be had to the accompanying drawings, wherein.

Figure 1:
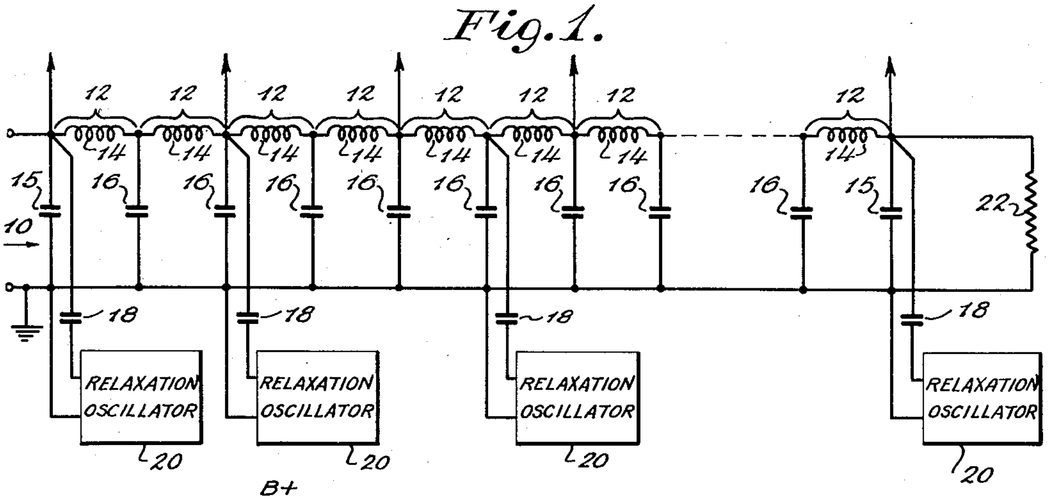
Fig. 1 is a schematic diagram of the present invention.
Figure 2:
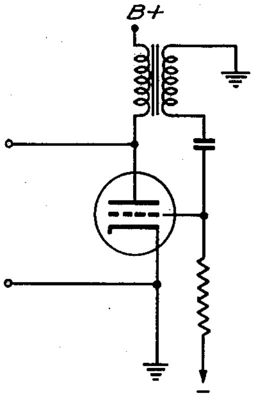
Fig. 2 is a schematic diagram of a blocking oscillator type relaxation oscillator suitable for use in the present invention.

With specific reference to the form of the invention illustrated in the drawings, the number 10 indicates generally a delay line which is preferably built up of a plurality of $\pi$-sections of series inductors 14 and shunt condensers 15. The shunt condensers of adjacent sections, however, are lumped together in a single condenser 16 which is twice the capacity of the shunting condenser 15 in the end of $\pi$-sections. Coupled in shunt at various points along the delay line by means of coupling condensers 18 are a plurality of relaxation oscillators indicated generally at 20. In the preferred form of the invention, the relaxation oscillators 20 are of the conventional "one-shot" blocking oscillator type, a schematic diagram of which is shown in Fig. 2.

One suitable delay line is made up of sections having a series inductance 14 of 160 μh., and a shunting capacitance 15 of 210 μμf. to produce a time delay of .26 μsec. per section. The delay line is terminated by a resistor 22 of 620 ohms which matches the characteristic impedance of the delay line 10 to prevent reflection of energy back along the line. One of the advantages of the present invention resides in the fact that a relatively low quality, low cost delay line may be employed, it being only necessary to sustain the triggering pulse amplitude and waveshape along a relatively short portion of the line between the shunting relaxation oscillators, as will hereinafter become apparent.

The operation of the regenerative delay line circuit is as follows. A sharp negative trigger pulse is applied to the input of the delay line 10. As the trigger pulse travels down the delay line, it is coupled through condenser 18 to the plate circuit of the first blocking oscillator 20, causing the oscillator to "fire." As the blocking oscillator fires, it couples energy back into the delay line, which in effect regenerates the initiating trigger pulse. The regenerated pulse continues down the delay line to the next blocking oscillator which in turn is fired. Thus, as successive blocking oscillators along the delay line are fired, the triggering pulse passing down the delay line is successively regenerated.

While the energy coupled back into the delay line by the firing of a particular blocking oscillator regenerates and moves down the line simultaneously with the initiating pulse, it is apparent that the regenerated energy divides, a portion of the energy moving in the opposite direction back along the delay line 10 toward the input to the delay line. However, it has been found that the regenerated pulse moving back along the line does not affect preceding blocking oscillators because the recovery time of any one blocking oscillator is appreciably longer than the time required for the regenerated pulse from the next subsequent blocking oscillator to return. Thus, the blocking oscillators are not affected by the regenerated pulse of the succeeding oscillator and the attenuation of the delay line is such that the amplitude of the regenerated pulses transmitted back to the preceding blocking oscillators along the line which have recovered is insufficient to trigger these preceding blocking oscillators.

It has been found in practice that reliable operation is obtained by making the recovery time of the blocking oscillators approximately a third the time interval between successive initiating input pulses, but this is not at all critical and much shorter recovery time may be used. A repetition frequency of the input pulses has been successfully employed of the order of 800 pulses per second with the delay line described, with as many as ten or twelve sections of line between oscillators, although this does not necessarily represent the upper limit of operation.

One of the features of the present invention is that if any one of the blocking oscillators along the delay line should be rendered inoperative, triggering pulses are not interrupted by the inoperative blocking oscillator, but continue down the line to trigger the next blocking oscillator.

The delay line can be of any length, no special precaution being required to prevent attenuation and distortion of waveshape. Delayed output pulses can be tapped off at any desired points along the delay line. The blocking oscillators can be connected at various points along the delay line, preferably at points where an output pulse is tapped off. However, the length of delay line between any two blocking oscillators cannot be such that attenuation and distortion of the pulse is such as to prevent triggering of a subsequent blocking oscillator. While the delay line has been illustrated and described as having lumped constants, it will be understood that a distributed impedance transmission line may be utilized as well.

Figure 3:
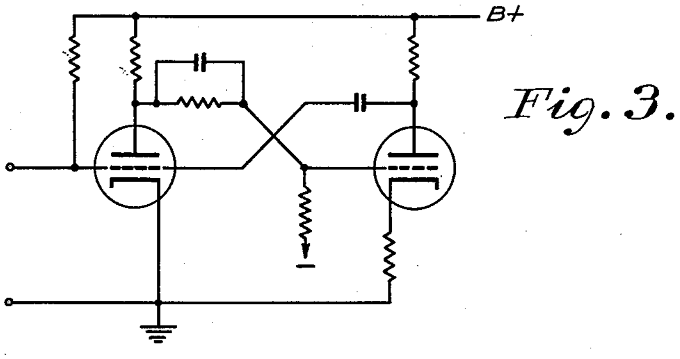
Fig. 3 is a schematic diagram of a "one-shot" multivibrator type relaxation oscillator suitable for use in the present invention.

In an alternative arrangement, a conventional "one-shot" multivibrator of the type shown schematically in Fig. 3 may be substituted for the above described blocking oscillator. Here again the regeneration of the trigger pulse does not affect preceding multivibrators because the regenerated pulse occurs during the time when the preceding multivibrator grid is insensitive to negative triggering.

From the above description, it will be recognized that the objects of the invention have been achieved by the provision of a delay line trigger circuit in which a simple delay line which requires no special provision for minimizing attenuation and waveshape distortion is utilized to obtain a succession of output pulses at predetermined delayed intervals following sequentially an initiating input pulse. The delay line can be of any desired length by providing a sufficient number of blocking oscillators to regenerate the trigger pulse as it travels along the line. The triggering pulse is kept sharp and large in amplitude to insure accurate triggering along the full length of the delay line.

Since many changes could be made in the above construction and many apparently widely different embodiments of this invention could be made without departing from the scope thereof, it is intended that all matters contained in the above description or shown in the accompanying drawings shall be interpreted as illustrative and not in a limiting sense.

What is claimed is:

1. Apparatus for generating a sharp output pulse at any desired interval of time following an initiating input pulse, said apparatus comprising a delay line including a large number of network sections, each section having lumped impedance elements for producing a predetermined delay time, the input pulse being coupled to one end of the delay line, a large number of blocking oscillators connected in shunt across the delay line, each oscillator including a vacuum tube having a cathode, control grid, and plate, the plates of the respective blocking oscillator tubes being capacity coupled to the delay line at spaced points along the delay line, the blocking oscillators having a recovery time substantially longer than the delay time of the line between said points, the delay line attenuating a pulse transmitted along the line at a rate such as to substantially dissipate the pulse in a shorter time interval than the recovery time of the blocking oscillators whereby energy pulses fed back into the delay line by the triggering of the blocking oscillators are dissipated in travelling back to the input end of the line but are regenerated by the triggering of subsequent blocking oscillators in travelling away from the input of the line, and impedance means connected across the other end of the delay line for terminating the line in its characteristic impedance.

2. Apparatus for generating a sharp output pulse at any desired interval of time following an initiating input pulse, said apparatus comprising a delay line, said input pulse being coupled to one end of the delay line, and a plurality of blocking oscillators connected in shunt across the delay line, each of the blocking oscillators including a vacuum tube having a cathode, a control grid, and a plate, the plates of the respective oscillator tubes being capacity coupled to the delay line at spaced points along the line, the blocking oscillators having a recovery time substantially longer than the delay time intervals between said spaced points, whereby the blocking oscillators feed energy pulses back into the line which regenerate the input pulse as it travels along the line.

References Cited in the file of this patent

FOREIGN PATENTS 651,290 Great Britain ............ Mar. 14, 1951